(12) United States Patent
Caradonna et al.

(10) Patent No.: US 8,983,822 B2
(45) Date of Patent: *Mar. 17, 2015

(54) OPERATING A STORAGE SERVER ON A VIRTUAL MACHINE

(71) Applicant: NetApp, Inc., Sunnyvale, CA (US)

(72) Inventors: Joseph Caradonna, Ashland, MA (US); Brian McCarthy, Nashua, NH (US)

(73) Assignee: NetApp, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/966,146

(22) Filed: Aug. 13, 2013

(65) Prior Publication Data

US 2014/0165057 A1 Jun. 12, 2014

Related U.S. Application Data

(63) Continuation of application No. 12/215,487, filed on Jun. 27, 2008, now Pat. No. 8,532,973.

(51) Int. Cl.
*G06F 9/44* (2006.01)
*G06F 13/10* (2006.01)
*G06F 13/12* (2006.01)
*G06F 9/455* (2006.01)
(Continued)

(52) U.S. Cl.
CPC ........ *G06F 9/45533* (2013.01); *G06F 17/5022* (2013.01); *G06F 3/067* (2013.01); *G06F 3/0607* (2013.01); *G06F 3/0664* (2013.01)
USPC ............................... 703/21; 703/13; 711/203

(58) Field of Classification Search
CPC ............ G06F 2009/45579; G06F 2009/45533; G06F 2009/455; G06F 9/45558; G06F 9/455; G06F 17/5022; G06F 3/067; G06F 3/0607; G06F 3/0664
USPC .................................. 703/13, 21, 23; 711/203
See application file for complete search history.

(56) References Cited

U.S. PATENT DOCUMENTS 7,328,144 B1 2/2008 Grier et al.
2006/0074618 A1 4/2006 Miller et al.
(Continued)

OTHER PUBLICATIONS

Non-Final Office Action, U.S. Appl. No. 12/215,487, dated Dec. 23, 2010, 18 pages.
(Continued)

*Primary Examiner* — Eunhee Kim
(74) *Attorney, Agent, or Firm* — DeLizio Gilliam, PLLC

(57) ABSTRACT

A system and method of testing, during development, the operation of a clustered storage server system and its associated storage operating system. The system includes at least one host computer having a host operating system, and at least one virtual computer having a simulated storage operating system, at least one simulated disk, a simulated NVRAM, and a simulated flashcard within a guest operating system hosted by the host operating system. The simulated storage operating system represents an actual storage operating system. Facilities of the simulated storage operating system including the simulated disk, the simulated NVRAM, and the simulated flashcard are mapped onto corresponding facilities of the host operating system via virtualization components of the virtual computer so that the simulated storage operating system operates substantially the same as the actual storage operating system on low cost host hardware platforms.

27 Claims, 7 Drawing Sheets

(51) Int. Cl.
*G06F 17/50* (2006.01)
*G06F 3/06* (2006.01)

(56) References Cited

U.S. PATENT DOCUMENTS

2008/0229416 A1 9/2008 Stewart et al.
2008/0250222 A1 10/2008 Gokhale et al.

OTHER PUBLICATIONS

Final Office Action, U.S. Appl. No. 12/215,487, dated Jun. 7, 2011, 22 pages.

Non-Final Office Action, U.S. Appl. No. 12/215,487, dated Oct. 24, 2012, 21 pages.

Notice of Allowance, U.S. Appl. No. 12/215,487, dated May 13, 2013.

OPERATING A STORAGE SERVER ON A VIRTUAL MACHINE

CROSS-REFERENCE TO RELATED APPLICATIONS

This application is a Continuation of application Ser. No. 12/215,487, filed Jun. 27, 2008, now U.S. Pat. No. 8,532,973, which is hereby incorporated by reference.

STATEMENT REGARDING FEDERALLY SPONSORED RESEARCH OR DEVELOPMENT

—Not applicable—

BACKGROUND OF THE INVENTION

The present invention relates generally to network data storage systems, and more specifically to simulating a network data storage operating system as a virtualized operating system of a virtual computer.

As computer networks have become faster and more reliable, the deployment of network data storage systems in enterprise computing environments has become more widespread. In a typical enterprise computing environment, client systems such as computer workstations, database servers, web servers, and other application servers can access data stored remotely from the client systems; typically in one or more central locations. One or more computer networks, e.g., one or more local area networks (LANs) or wide area networks (WANs), connect the client systems to mass storage devices such as disks disposed at the central locations. Such centralized data storage, referred to hereinafter as network data storage, facilitates the sharing of data among many geographically distributed client systems. Network data storage also enables information systems (IS) departments to use highly reliable (sometimes redundant) computer equipment to store their data.

In the typical network data storage environment, specialized computers such as file servers, storage servers, storage appliances, etc. (referred to hereinafter as storage servers) located at the central locations make the data stored on the disks available to the client systems. For example, a storage server can have a monolithic architecture, in which network and data components are contained within a single device. Software running on the storage servers and other software running on the client systems communicate according to well-known protocols, such as the Network File System (NFS) protocol, the Common Internet File System (CIFS) protocol, and the Direct Access File System (DAFS) protocol, to make the data stored on the disks appear to users and application programs as though the data were stored locally on the client systems. Each storage server makes data available to the client systems by presenting or exporting one or more volumes to the client systems. Each volume is configured to store data files, scripts, word processing documents, executable programs, and the like. From the perspective of a client system, each volume can appear to be a single disk drive. However, each volume can represent the storage space in a single storage device, a redundant array of independent disks (RAID) or a RAID set, an aggregate of some or all of the storage space in a set of storage devices, or any other suitable set of storage space.

In addition, multiple storage servers can be arranged in a cluster configuration to form a single storage server system. Such a clustered storage server system has a distributed architecture that includes a plurality of server nodes interconnected by a switching fabric. Each server node typically includes a network module (an N-module), a disk module (a D-module), and a management module (an M-host). The N-module provides functionality that enables a respective node within the clustered system to connect to a client system over a computer network, the D-module provides functionality enabling the respective node to connect to one or more disks, and the M-host provides management functions for the clustered system. A switched virtualization layer is provided below the interface between the N-modules and the client systems, allowing the disks associated with the multiple nodes in the cluster configuration to be presented to the client systems as a single shared storage pool.

In a typical mode of operation, a client system transmits an NFS, CIFS, or DAFS request for data to one of the server nodes within the clustered system. The request typically includes a file handle for a data file stored in a specified volume. The N-module within the node that received the request extracts a volume identifier from the file handle, and uses the volume identifier to index a volume location database (VLDB) to obtain an identification of an aggregate storing the specified volume. The N-module then uses the aggregate identification to locate the D-module responsible for the aggregate, and transmits a request to the D-module for the data on the specified volume using an internal protocol. The D-module executes the request, and transmits, using the internal protocol, a response containing the requested volume data back to the N-module, which in turn transmits an NFS, CIFS, or DAFS response with the requested data to the client system. In this way, the N-modules can export, to the client systems, one or more volumes that are stored on aggregates accessible via the D-modules.

A storage operating system executes on a network data storage system to manage the storage system and to implement file system semantics. The storage operating system must be robust to prevent data loss from error conditions arising while executing on the network data storage system. Accordingly, during development, the storage operating system is generally thoroughly tested before being released for use in actual data serving environments.

One known method of performing tests of a storage operating system during development includes simulating the storage operating system on a host computer by executing portions of the storage operating system as a user-level application on the host computer. During execution of the user-level application on the host computer, simulated disks associated with the simulated storage operating system are represented by files on the host computer's file system. Further, write operations from a disk driver module of the simulated storage operating system are converted to file-level operations by the host's operating system. Similarly, network protocol communications, such as by TCP/IP, are passed from the simulated storage operating system to the host computer's operating system for processing. In addition, to simulate a cluster of storage appliances, two separate instantiations of the simulated storage operating system are executed as separate processes running on the host computer. However, the above-described method of simulating a storage operating system does not provide a simulation of the entire storage operating system as it would normally operate in an actual cluster environment.

It would therefore be desirable to have a system and method of testing, during development, the operation of a clustered storage server system and its associated storage operating system that allows the entire storage operating system to be simulated as it would normally operate in an actual cluster environment. Such a system and method of testing the operation of a clustered storage server system would facilitate the testing of the clustered system on low cost computer hardware platforms.

BRIEF SUMMARY OF THE INVENTION

In accordance with the present invention, a system and method of testing, during development, the operation of a clustered storage server system and its associated storage operating system is disclosed that allows the entire storage operating system to be simulated as it would operate within an actual cluster environment. The presently disclosed system and method facilitates the testing of the clustered system and its associated storage operating system on low cost computer hardware platforms.

Unlike existing methods of simulating a storage operating system in which portions of the storage operating system are executed as a user-level application on a host computer, the disclosed system and method allows the entire storage operating system to be simulated by executing it within a guest operating system of a virtual machine operating on a host computer. In one embodiment, one or more instantiations of the simulated storage operating system are executed as one or more guest operating systems of virtual machines operating on the same host computer hardware, thereby allowing multiple instantiations of the simulated storage operating system to co-exist on the same host computer with a high degree of isolation from one another. In another embodiment, multiple instantiations of the simulated storage operating system are executed as multiple guest operating systems of virtual machines operating simultaneously on multiple host computers interconnected by one or more computer networks, thereby forming a virtual cluster environment. In such a virtual cluster environment, each virtual machine operating on a respective host computer can represent a server node of an actual clustered storage server system.

By executing each simulated storage operating system as a guest operating system of a virtual machine operating on a respective host computer, a virtual clustered storage server system can be created having functionality that is practically indistinguishable from an actual clustered storage server system. Further, by using a combination of virtual machine devices and internal device emulation extensions, facilities of the simulated storage operating system, including those typically implemented by high cost components such as disks, non-volatile RAMs (NVRAMs), and compact flashcards, can be mapped onto lower cost peripherals associated with the host hardware platform via the virtual facilities of a virtual machine. For example, one or more simulated disks, a simulated NVRAM, and/or a simulated flashcard can be mapped onto a low cost disk of the host computer via a virtual disk of the virtual machine. Other facilities of the simulated storage operating system such as emulated cluster network adapters and/or emulated data and management network adapters can also be mapped, via virtual interfaces of the virtual machine, onto corresponding host interfaces of the host hardware platform. The combined use of virtual machine devices and internal device emulation extensions allows numerous disks, memories, and/or network adapters of different types to be simulated. The end result is a simulated software system that is largely unmodified from an actual system, and whose operation closely resembles actual system behavior, thereby permitting highly accurate simulations of actual data storage system configurations for both test and development.

In one embodiment, the presently disclosed system includes at least one host computer having a host operating system, and at least one virtual computer operating on the host computer. The virtual computer has a guest operating system, which is hosted by the host operating system of the host computer. The virtual computer also has, within the guest operating system, at least one simulated storage operating system and at least one simulated disk for storing data of at least one virtual volume. To test the operation of the storage operating system, the host computer can receive at least one user command for manipulating (i.e., reading or writing) data of a specified virtual volume stored on the simulated disk. In response to the user command, the simulated storage operating system executes within the guest operating system to manipulate the data of the specified virtual volume stored on the simulated disk in accordance with the user command. The virtual computer has, within the guest operating system, at least one simulated non-volatile memory for storing a record of the user command, and at least one emulated management network adapter for receiving the user command from the host computer.

In another embodiment, the presently disclosed system includes one or more host computers, and a plurality of virtual computers operating on the respective host computers. Each of the respective virtual computers has, within a respective guest operating system, a simulated storage operating system, at least one simulated disk for storing data of at least one virtual volume, and an emulated cluster network adapter. In this embodiment, each virtual computer can represent a server node of a clustered storage server system. The respective virtual computers can be communicably interconnected over at least one computer network via the respective emulated cluster network adapters and the respective host computers to form a simulated clustered storage server system.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

A system and method of testing, during development, the operation of a clustered storage server system and its associated storage operating system is disclosed that allows multiple instantiations of a simulated storage operating system to co-exist on the same host computer with a high degree of isolation from one another. The presently disclosed system and method also allows the respective instantiations of the simulated storage operating system to operate on separate host computers to create a virtual clustered storage server system having functionality that is practically indistinguishable from an actual clustered storage server system. The presently disclosed system and method of testing the operation of a clustered storage server system facilitates the testing of the clustered system and its associated storage operating system on low cost computer hardware platforms.

A. Clustered Storage Server System

Figure 1:
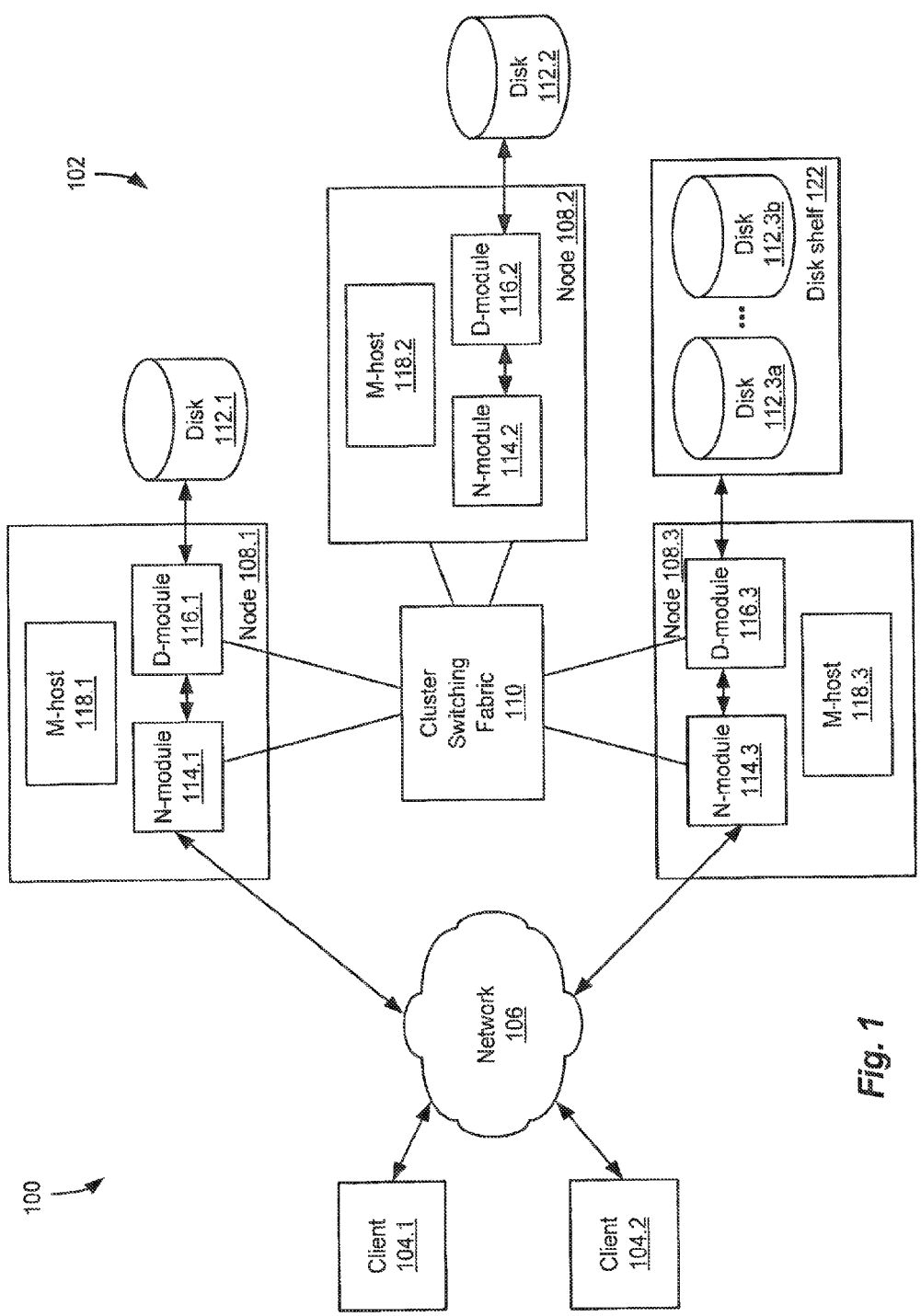
FIG. 1 is a block diagram of a clustered storage server system including a plurality of server nodes.

FIG. 1 depicts an illustrative embodiment of a network data storage environment 100, including a plurality of client systems 104.1-104.2, a clustered storage server system 102, and at least one computer network 106 communicably interconnecting the client systems 104.1-104.2 and the clustered storage server system 102. As shown in FIG. 1, the clustered storage server system 102 includes a plurality of server nodes 108.1-108.3, a cluster switching fabric 110, and a plurality of mass storage devices such as disks 112.1-112.2 and a disk shelf including disks 112.3a-112.3b. Each of the plurality of nodes 108.1-108.3 is configured to include an N-module, a D-module, and an M-host, each of which can be implemented as a separate software module. Specifically, the node 108.1 includes an N-module 114.1, a D-module 116.1, and an M-host 118.1, the node 108.2 includes an N-module 114.2, a D-module 116.2, and an M-host 118.2, and the node 108.3 includes an N-module 114.3, a D-module 116.3, and an M-host 118.3. The N-modules 114.1-114.3 include functionality that enables the respective nodes 108.1-108.3 to connect to one or more of the client systems 104.1-104.2 over the computer network 106, while the D-modules 116.1-116.3 connect to one or more of the disks 112.1-112.2 and the disk shelf 122. The M-hosts 118.1-118.3 provide management functions for the clustered storage server system 102.

A switched virtualization layer including a plurality of virtual network interfaces (VIFs) is provided below the interface between the respective N-modules 114.1-114.3 and the client systems 104.1-104.2, allowing the disks 112.1-112.2, 112.3a-112.3b associated with the respective nodes 108.1-108.3 to be presented to the client systems 104.1-104.2 as a single shared storage pool. The nodes 108.1-108.3 are interconnected by the switching fabric 110, which, for example, may be embodied as a Gigabit Ethernet switch. Although FIG. 1 depicts an equal number (i.e., 3) of N-modules 114.1-114.3, D-modules 116.1-116.3, and M-Hosts 118.1-118.3, any other suitable number of N-modules, D-modules, and M-Hosts may be provided. There may also be different numbers of N-modules, D-modules, and/or M-Hosts within the clustered storage server system 102. For example, in alternative embodiments, the clustered storage server system 102 may include a plurality of N-modules and a plurality of D-modules interconnected in a configuration that does not reflect a one-to-one correspondence between the N-modules and D-modules. The clustered storage server system 102 can include the NETAPP® DATA ONTAP® storage operating system, available from NetApp, Inc., Sunnyvale, Calif., USA, that implements the WAFL® file system, or any other suitable storage operating system.

The client systems 104.1-104.2 of FIG. 1 may be implemented as general-purpose computers configured to interact with the respective nodes 108.1-108.3 in accordance with a client/server model of information delivery. In the presently disclosed embodiment, the interaction between the client systems 104.1-104.2 and the nodes 108.1-108.3 enable the provision of network data storage services. Specifically, each client system 104.1, 104.2 can request the services of the respective node 108.1, 108.2, 108.3, and that node can return the results of the services requested by the respective client system by exchanging packets over the computer network 106, which may be wire-based, optical fiber, wireless, or any other suitable combination thereof. The client systems 104.1-104.2 can issue packets according to file-based access protocols such as the Network File System (NFS) protocol, the Common Internet File System (CIFS) protocol, and the Direct Access File System (OAFS) protocol over the Transmission Control Protocol/Internet Protocol (TCP/IP), when accessing information in the form of files and directories. In an alternative embodiment, the client systems 104.1-104.2 can issue packets including block-based access protocols, such as the Small Computer Systems Interface (SCSI) protocol encapsulated over TCP (iSCSI) or the Fibre Channel Protocol (FCP), when accessing information in the form of blocks. It is noted that the network data storage environment 100 supports file-based and/or block-based access requests.

In a typical mode of operation, one of the client systems 104.1-104.2 transmits an NFS, CIFS, or DAFS request for data to one of the nodes 108.1-108.3 within the clustered storage server system 102. The client request typically includes a file handle for a data file stored in a specified volume on one or more of the disks 112.1-112.2, 112.3a-112.3b. The N-module included in that node processes the client request, translating the request into a Remote Procedure Call (RPC) using an internal protocol, such as the SpinNP protocol available from NetApp, Inc. Next, the N-module transmits the SpinNP RPC over the cluster switching fabric 110 to the node that includes the D-module associated with the target volume. Upon receipt of the SpinNP RPC, the D-module of the node responsible for the target volume processes the RPC. The D-module then transmits an internal SpinNP response containing the requested data to the N-module, which, in turn, transmits an NFS, CIFS, or DAFS response containing the requested data to the client system.

Figure 2:
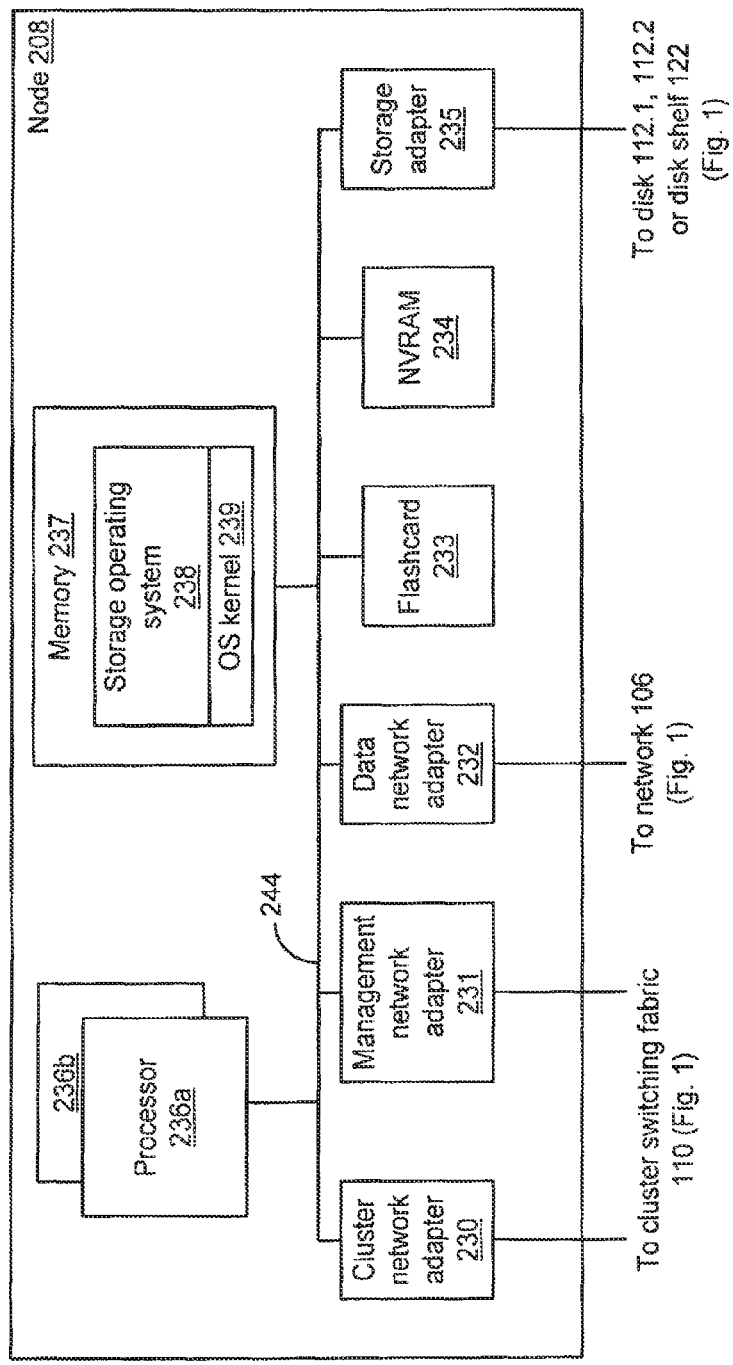
FIG. 2 is a block diagram illustrating a node of the clustered storage server system of FIG. 1.

FIG. 2 depicts an illustrative embodiment 208 of one of the server nodes 108.1-108.3 included in the network data storage environment 100 (see FIG. 1). As shown in FIG. 2, the node 208 is embodied as a storage system including a plurality of processors 236a, 236b, at least one memory 237, a flashcard 233, a non-volatile RAM (NVRAM) 234, and a plurality of adapters interconnected by a system bus 244. The plurality of adapters includes a network adapter 230 for cluster traffic (referred to hereinafter as a cluster network adapter), a network adapter 231 for management traffic (referred to hereinafter as a management network adapter), a network adapter 232 for data traffic (referred to hereinafter as a data network adapter), and an adapter 235 for storage traffic (referred to hereinafter as a storage adapter). The cluster network adapter 230 and the management network adapter 231 each include a plurality of ports adapted to couple the node 208 to other ones of the nodes within the clustered storage server system 102. In the illustrated embodiment, Ethernet is used as the clustering protocol and interconnect media, although any other suitable types of protocols and interconnects may be employed. In alternative embodiments in which the N-modules and the D-modules are implemented on separate storage systems or computers, the cluster network adapter 230 is utilized by the N-modules or the D-modules for communicating with other network or disk modules within the network data storage environment 100.

As shown in FIG. 2, the node 208 is illustratively embodied as a dual processor storage system executing a storage operating system 238, which implements a high-level module such as a file system for logically organizing stored information as a hierarchical structure of named directories, files, and blocks on the disks 112.1-112.2, 112.3a-112.3b. In the illustrated embodiment, the dual processor storage system also executes an operating system (OS) kernel 239 such as the FreeBSD operating system kernel that manages the interaction between hardware components and higher-level software applications running on the node 208. It will be apparent to those of ordinary skill in the art that the node 208 may alternatively comprise a single processor system, or a processor system with more than two processors. In the illustrated embodiment, the processor 236a executes the functions of an N-module, while the processor 236b executes the functions of a D-module.

The memory 237 illustratively comprises storage locations that are addressable by the processors 236a, 236b and the various adapters 230, 231, 232, 235 for storing software program code and data structures. The storage operating system 238, portions of which are typically resident in the memory 237 and executed by the processors 236a-236b, functionally organizes the node 208 by invoking storage operations in support of the storage service implemented by the node 208. It will be apparent to those skilled in the art that other processing and memory means, including various computer readable media, may be employed for storing and executing program instructions.

The data network adapter 232 comprises a plurality of ports adapted to couple the node 208 to one or more of the client systems 104.1-104.2 over point-to-point links, wide area networks (WANs), virtual private networks (VPNs) implemented over a public network (e.g., the Internet), or a shared local area network (LAN). The data network adapter 232 may therefore comprise mechanical, electrical, optical, or other connection and signaling components to connect the node 208 to a network. For example, the computer network 106 may be embodied as an Ethernet network, a Fiber Channel (FC) network, or any other suitable network. Each of the client systems 104.1-104.2 can communicate with the node 208 over the network 106 by exchanging discrete frames or packets of data according to pre-defined protocols, such as TCP/IP.

The storage adapter 235 cooperates with the storage operating system 238 executing on the node 208 to access information requested by the client systems 104.1-104.2. The information may be stored on any type of attached array of writable storage device media such as video tape, optical, DVD, magnetic tape, bubble memory, electronic random access memory, micro-electro mechanical, and any other suitable media adapted to store information. In the illustrated embodiment, such information can be stored on the disks 112.1-112.2 and/or on the disks 112.3a-112.3b of the disk shelf 122. The storage adapter 235 comprises a plurality of ports having input/output (I/O) interface circuitry that couples to the disks over an I/O interconnect arrangement such as a high-performance FC link topology.

The NVRAM 234 is a battery-backed non-volatile memory that is included in the node 208 to improve overall system performance. For example, responsive to a data write request of one of the client systems 104.1-104.2, data written by the respective client system can initially be stored in the NVRAM 234 before the node 208 acknowledges the completion of the data write request. The data can then be transferred to one of the disks 112.1-112.2 or to the disk shelf 122. Within the clustered storage server system 102, each of the nodes 108.1-108.3 can maintain a copy of the data stored in the NVRAM of the other nodes to assure that each node in the clustered system 102 can takeover the operations and workload of another node in the event of a node failure. After taking over from a node that failed, a node can handle file service requests that are normally routed to it from the client systems 104.1-104.2 in addition to file service requests that had been previously handled by the failed node.

The flashcard 233 is included in the node 208 to facilitate the shipping of software program code updates and/or the downloading of stored data to a local or remote computer for further processing and analysis. For example, the flashcard 233 may be implemented as a removable compact flashcard device.

B. Storage Operating System

In the illustrated embodiment, the storage operating system 238 is preferably the NETAPP® DATA ONTAP® storage operating system, available from NetApp, Inc., which implements a Write Anywhere File Layout (WAFL®) file system. It is understood, however, that any other suitable storage operating system implementing any other suitable file system may be employed.

Figure 3:
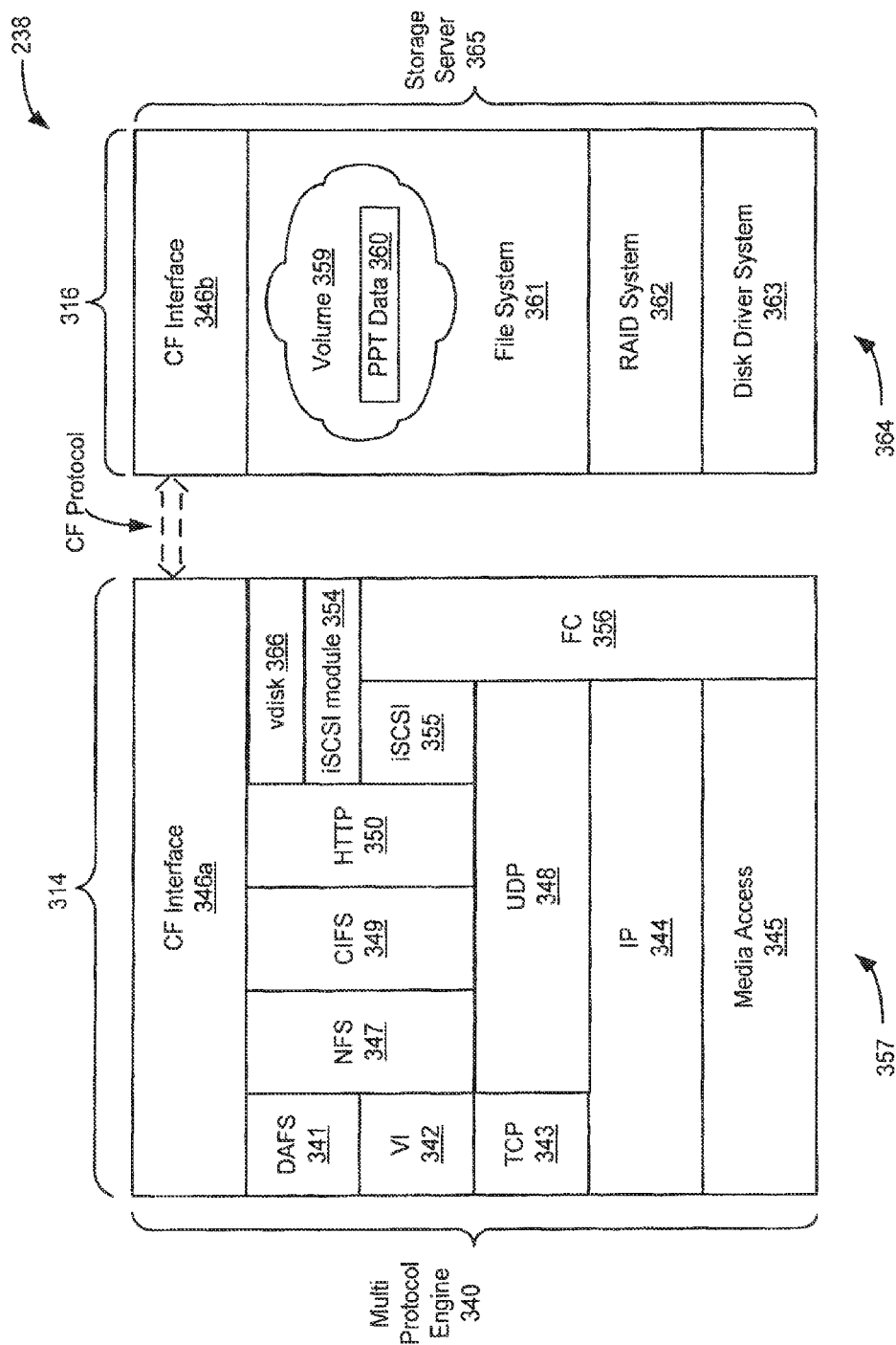
FIG. 3 is a block diagram illustrating a storage operating system that is executable on the clustered storage server system of FIG. 1.

As shown in FIG. 3, the storage operating system 238 comprises a series of software layers organized to form an integrated network protocol stack or, more generally, a multi-protocol engine 340 that provides data paths for the client systems 104.1-104.2 to access information stored on the respective nodes 108.1-108.3 using block and file access protocols. The multi-protocol engine 340 includes a media access layer 345 of network drivers, for example, gigabit Ethernet drivers, that interfaces to network protocol layers, such as an IP layer 344 and supporting transport mechanisms, namely, a TCP layer 343 and a User Datagram Protocol (UDP) layer 348. A file system protocol layer provides multi-protocol file access and, to that end, includes support for a DAFS protocol 341, an NFS protocol 347, a CIFS protocol 349, and a Hypertext Transfer Protocol (HTTP) 350. A virtual interface (VI) layer 342 implements the VI architecture to provide direct access transport (DAT) capabilities, such as RDMA, as required by DAFS protocol 341. An iSCSI driver layer 355 provides block protocol access over the TCP/IP network protocol layers, while an FC driver layer 356 receives and transmits data access requests to and responses from a respective node. The FC and iSCSI drivers provide FC-specific and iSCSI-specific access control to the data and manage exports of logical units (funs) to the iSCSI or FC components. Incoming data access requests are converted into file system commands that are embedded within cluster fabric (CF) protocol messages by CF interface modules 346a-346b, which cooperate to provide a single file system image across all disk modules of the clustered storage server system 102.

In addition, the storage operating system 238 includes a series of software layers organized to form a storage server 365 that provides data paths for accessing information stored on the disks 112.1-112.2 and on the disk shelf 122. The storage server 365 includes a file system module 361 for managing volumes 359, a RAID system module 362, and a disk driver system module 363. The RAID system 362 manages the storage and retrieval of information to and from the volumes/disks in accordance with I/O operations, while the disk driver system 363 implements a disk access protocol such as, e.g., the SCSI protocol. It is noted that an aggregate, i.e., a collection of volumes, can be divided into a number of virtual volumes, which can be manipulated (read from or written to) through one or more virtual storage servers hosted by the hardware of the server node 208.

The file system 361 implements a virtualization system of the storage operating system 238 through interaction with one or more virtualization modules illustratively embodied as, e.g., a virtual disk (vdisk) module 366 and a SCSI target module 354. The vdisk module 366 enables access by administrative interfaces, such as a user interface of a management framework, in response to a user (system administrator) issuing commands to one of the nodes 108.1-108.3. The SCSI target module 354 is disposed between the FC and iSCSI drivers 355, 356 and the file system 361 to provide a translation layer of the virtualization system between the block (lun) space and the file system space, where luns are represented as blocks.

The file system 361 is illustratively a message-based system that provides logical volume management capabilities for use in access to the information stored on the disks 112.1-112.2 and on the disk shelf 122. That is, in addition to providing file system semantics, the file system 361 provides functions normally associated with a volume manager. These functions include aggregation of the disks, aggregation of storage bandwidth of the disks, and reliability guarantees, such as mirroring and/or parity. The file system 361 illustratively implements the WAFL® file system having an on-disk format representation that is block-based, and using index nodes (inodes) to identify files and file attributes (such as creation time, access permissions, size, and block location). It is understood, however, that the file system 361 may implement any other suitable file system. The file system 361 uses files to store metadata such as that describing the layout of its file system. These metadata files include, among others, an inode file. A file handle, i.e., an identifier that includes an inode number, is used to retrieve an inode from a disk.

Operationally, a request from one of the client systems 104.1-104.2 is forwarded as a packet over the computer network 106 to one of the nodes 108.1-108.3 where it is received at the data network adapter 232. A network driver (of the layer 345 or the layer 356) processes the packet and, as appropriate, passes it on to a network protocol and file access layer for additional processing prior to forwarding to the file system 361. Here, the file system 361 generates operations to load (retrieve) the requested data from one of the disks 112.1, 112.2 or from the disk shelf 122 if it is not cached in the memory 237. If the information is not in the memory 237, then the file system 361 indexes into the inode file using the inode number to access an appropriate entry and retrieve a logical volume block number (VBN). The file system 361 then passes a message structure including the logical VBN to the RAID system 362. The logical VBN is mapped to a disk identifier and disk block number (DBM), and sent to an appropriate driver (e.g., SCSI) of the disk driver system 363, which accesses the DBN from the specified disk and loads the requested data block(s) in memory for processing by the respective node. Upon completion of the processing of the client request, the respective node typically returns a response to the client system over the network 106.

C. Simulated Storage Operating System

Figure 5:
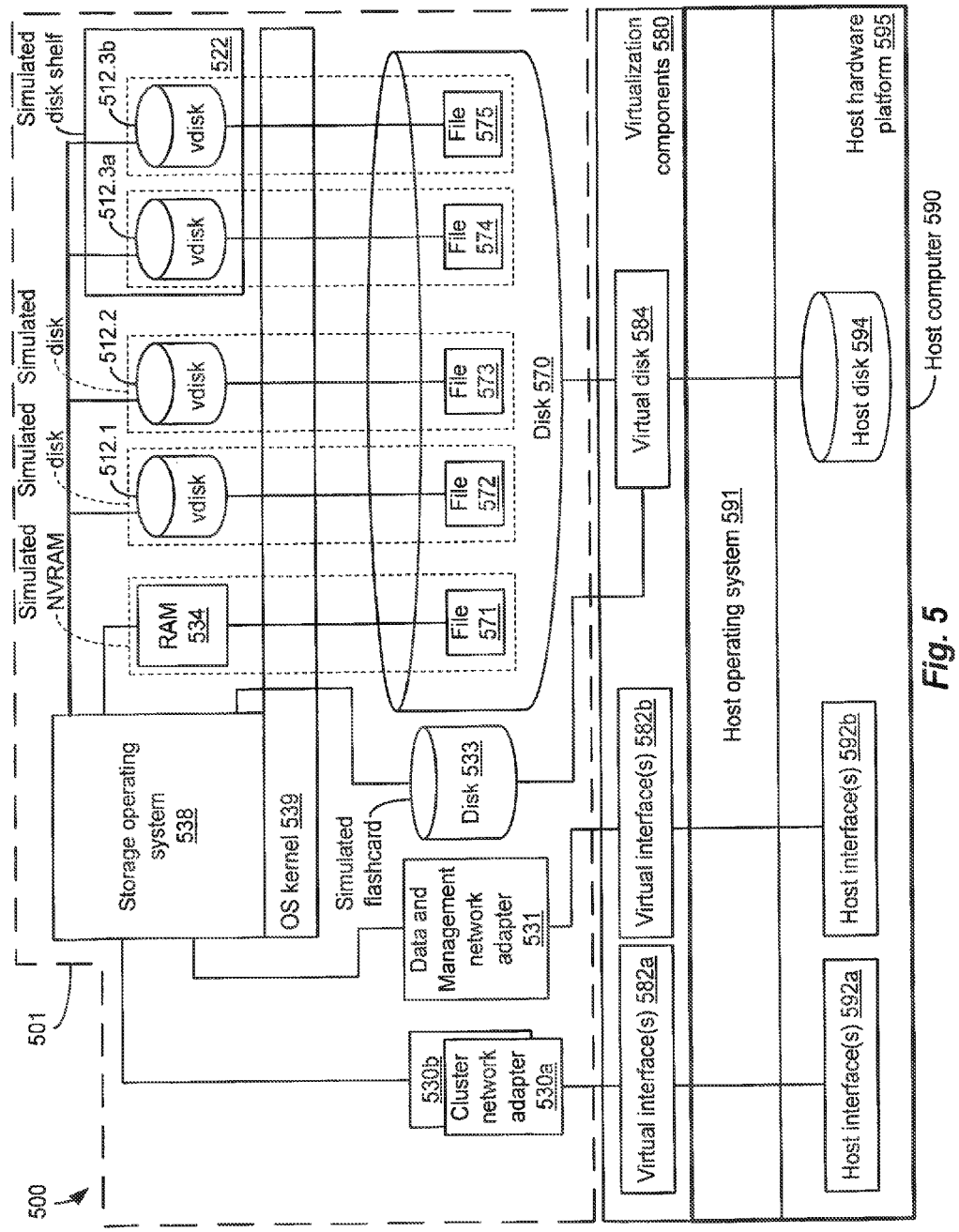
FIG. 5 is a block diagram of the storage operating system of FIG. 3 modified to execute as a virtualized operating system of a virtual computer.

To facilitate the testing, during development, of the clustered storage server system 102 (see FIG. 1) and its associated storage operating system 238/239 (see FIGS. 2-3), a simulated storage operating system 501 is provided that can be executed in a virtualized computer environment 500 (see FIG. 5). The presently disclosed simulated storage operating system 501 will be better understood following the discussion below relating to how the storage operating system 238/239 can be modified to allow a representation of the clustered storage server system 102 to be implemented on a computer hardware platform that does not include the flashcard 233, the non-volatile memory (NVRAM) 234, the disks 112.1-112.2, or the disk shelf 122 of the clustered system 102.

Figure 4:
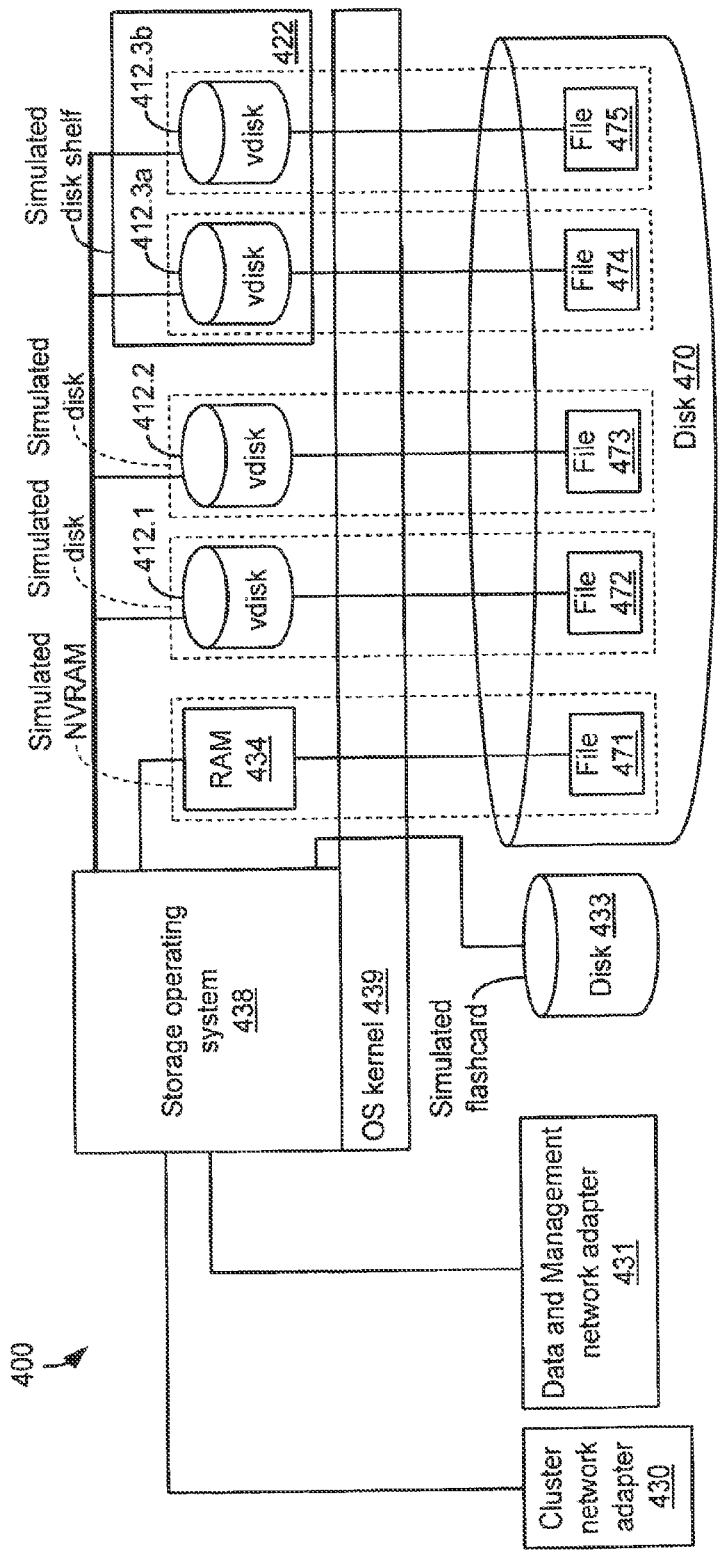
FIG. 4 is a block diagram of the storage operating system of FIG. 3 modified to execute on a conventional computer hardware platform.

FIG. 4 depicts an illustrative embodiment of a storage operating system 438/439 modified to execute in a computer environment 400 comprising a computer hardware platform that does not include a flashcard, a non-volatile memory (NVRAM), and disks for storing volume data. In the illustrated embodiment, the computer environment 400 includes the storage operating system 438 such as the NETAPP® DATA ONTAP® storage operating system, the operating system kernel 439 such as the FreeBSD operating system kernel, a cluster network adapter 430, and a data and management network adapter 431. As discussed above, the computer environment 400 does not include the flashcard 233 (see FIG. 2), the non-volatile memory (NVRAM) 234 (see FIG. 2), nor does it include the disks 112.1-112.2 or the disk shelf 122 (see FIG. 1) for storing volume data.

Accordingly, the computer environment 400 includes a simulated NVRAM. In this context, the simulation of the NVRAM means that the operation of the NVRAM is represented by a Random Access Memory (RAM) 434 backed-up by a data file 471 contained in a standard mass storage device such as a disk 470. The simulated NVRAM is accessible via the operating system kernel 439. The computer environment 400 also includes a plurality of simulated disks and a simulated disk shelf. Each of the simulated disks is implemented by a virtual disk (vdisk) backed-up by a data file contained in the disk 470 and accessible via the operating system kernel 439. Specifically, a first simulated disk is implemented by a vdisk 412.1 backed-up by a data file 472, and a second simulated disk is implemented by a vdisk 412.2 backed-up by a data file 473. Similarly, third and fourth simulated disks of a simulated disk shelf 422 are implemented by vdisks 412.3a, 412.3b backed-up by data files 474a, 474b, respectively. In addition, the computer environment 400 includes a simulated flashcard implemented by a standard mass storage device such as a disk 433 accessible via the operating system kernel 439. As illustrated in FIG. 4, the disk 433 is separate from the disk 470. In one embodiment, the simulated flashcard is implemented by the separate disk 433 to allow program code updates and/or data to be downloaded to the simulated flashcard without impacting the simulated NVRAM or the simulated disks which are backed-up by respective data files contained in the disk 470. In alternative embodiments, the simulated flashcard can be implemented as a data file contained in the disk 470, or as a partition of the disk 470. By configuring the storage operating system 438/439 to operate in conjunction with the simulated flashcard 433, the simulated NVRAM 434/471, and the simulated disks 412.1/472, 412.2/473, 412.3a/474, 412.3b/475 in the computer environment 400, the storage operating system 438/439 can be configured to execute on computer hardware platforms that do not include flashcards, non-volatile memories, and disks for storing volume data.

It is noted that the cluster network adapter 430, the data and management network adapter 431, the RAM 434, and the vdisks 412.1-412.2, 412.3a-412.3b are illustrated in FIG. 4 as being directly connected to the storage operating system 438 for clarity of illustration. It will be apparent to those of ordinary skill in the art that, in a practical implementation, the operating systems 438/439, the RAM 434, and the vdisks 412.1-412.2, 412.3a-412.3b can be implemented in one or more suitable memories communicably interconnected with the cluster network adapter 430, the data and management network adapter 431, the disk 433, and the disk 470 via one or more suitable buses. It will be further appreciated that, in a practical implementation, the computer environment 400 can include one or more processors operative to execute the storage operating systems 438/439 and software applications out of at least one memory.

The storage operating system 438/439 in the computer environment 400 can be further modified to execute as a virtualized (guest) operating system of a virtual computer (virtual machine). FIG. 5 depicts an illustrative embodiment of the virtualized computer environment 500, including the simulated storage operating system 501 executing as a guest operating system of a virtual machine, in accordance with the present invention. Unlike prior methods of simulating a storage operating system in which portions of the storage operating system are executed as a user-level application on a host computer, the virtualized computer environment 500 allows an entire storage operating system to be simulated by executing the storage operating system 501 as a guest operating system of a virtual machine operating on a host computer. One or more instantiations of the simulated storage operating system 501 can be executed as one or more guest operating systems of virtual machines operating simultaneously on the same host computer hardware, thereby allowing multiple instantiations of the simulated storage operating system to co-exist on the same host computer with a high degree of isolation from one another. Alternatively, multiple instantiations of the simulated storage operating system 501 can be executed as multiple guest operating systems of virtual machines operating simultaneously on multiple host computers interconnected by one or more computer networks, thereby forming a virtual cluster environment. In such a virtual cluster environment, each virtual machine operating on a respective host computer can represent a server node of an actual clustered storage server system. By executing each simulated storage operating system 501 as a guest operating system of a virtual machine operating on a respective host computer, a virtual clustered storage server system can be created having functionality that is practically indistinguishable from an actual clustered storage server system. In addition, facilities of the storage operating system, including high cost components such as the mass storage devices, the non-volatile RAM, and the flashcard can be mapped onto one or more lower cost peripherals associated with the host hardware platform via the virtual facilities of a virtual machine.

As shown in FIG. 5, the virtualized computer environment 500 comprises the simulated storage operating system 501 including a storage operating system 538 such as the NETAPP® DATA ONTAP® storage operating system or any other suitable storage operating system, an operating system kernel 539 such as the FreeBSD operating system kernel or any other suitable operating system kernel, one or more emulated cluster network adapters 530a-530b, and at least one emulated data and management network adapter 531. Like the computer environment 400, the virtualized computer environment 500 includes a simulated NVRAM implemented by a RAM 534 backed-up by a data file 571 contained in standard mass storage such as a disk 570, a first simulated disk implemented by a vdisk 512.1 backed-up by a data file 572 contained in the disk 570, a second simulated disk implemented by a vdisk 512.2 backed-up by a data file 573 contained in the disk 570, a third simulated disk implemented by a vdisk 512.3a backed-up by a data file 574a contained in the disk 570, and a fourth simulated disk implemented by a vdisk 512.3b backed-up by a data file 574b contained in the disk 570. The virtualized computer environment 500 also includes a simulated flashcard implemented by a standard mass storage device such as a disk 533 accessible via the operating system kernel 539. As illustrated in FIG. 5, the disk 533 is separate from the disk 570. As discussed above with reference to the simulated flashcard of FIG. 4, the simulated flashcard of FIG. 5 can be implemented in alternative embodiments as a data file contained in the disk 570, or as a partition of the disk 570. Accordingly, the simulated storage operating system 501 is configured to provide the functionality of a server node, including its associated disk(s) for storing volume data, within a clustered storage server system.

In addition, the virtualized computer environment 500 includes virtualization components 580, an underlying computer (host) software operating system 591, and an underlying host computer hardware platform 595. As shown in FIG. 5, the virtualization components 580 include virtual network interfaces 582a-582b and a virtual disk 584, and the underlying host hardware platform 595 includes host network interfaces 592a-592b and a standard mass storage device such as a host disk 594. For example, the virtualization components 580 may be implemented using virtualization software available from VMware, Inc., Palo Alto, Calif., USA, or any other suitable virtualization software. Further, the host software operating system 591 may be the OS/X operating system available from Apple, Inc., Cupertino, Calif., USA, the Windows operating system available from Microsoft Corporation, Redmond, Wash., USA, the open source Linux operating system, or any other suitable software operating system. The virtual interfaces 582a-582b are configured to interface the emulated cluster network adapters 530a-530b and the emulated data and management network adapter 531 to the respective network interfaces 592a-592b of the host hardware platform 595.

Accordingly, the host operating system 591 can be executed on the host computer hardware platform 595, while one or more instantiations of the simulated storage operating system 501 are executed as one or more guest operating systems running on the host operating system 591. Further, the virtualization components 580 include virtual interfaces such as the virtual network interfaces 582a-582b and the virtual disk 584, which provide a virtualized computer environment in which the simulated storage operating system(s) 501 can be run. In this configuration, the facilities of the simulated storage operating system 501 (including the simulated disks, the simulated NVRAM, the simulated flashcard, the emulated cluster network adapters 530a-530b, and the emulated data and management network adapter 531) can be mapped onto corresponding facilities of the host operating system 591 via the virtualization components 580. For example, each simulated disk implemented by a vdisk backed-up by a data file can be mapped onto the host disk 594 via the virtual disk 584. Similarly, the simulated NVRAM implemented by the RAM 534 backed-up by the data file 571 can be mapped onto the host disk 594 via the virtual disk 584. In addition, the simulated flashcard implemented by the disk 533 can be mapped onto the host disk 594 via the virtual disk 584. In this way, the simulated disks, the simulated NVRAM, and the simulated flashcard, which are typically implemented by high cost components, can be mapped onto one or more lower cost peripherals associated with the host hardware platform 595, such as the host disk 594. In addition, the emulated cluster network adapters 530a-530b and the emulated data and management network adapter 531 can be mapped, via the virtual interfaces 582a, 582b, respectively, onto the host interfaces 592a, 592b of the host hardware platform 595.

It is noted that the emulated cluster network adapters 530a-530b, the emulated data and management network adapter 531, the RAM 534, and the vdisks 512.1-512.2, 512.3a-512.3b are illustrated in FIG. 5 as being directly connected to the storage operating system 538 for clarity of illustration. It will be apparent to those of ordinary skill in the art that, in a practical implementation, the operating systems 538/539, the RAM 534, and the vdisks 512.1-512.2, 512.3a-512.3b can be implemented in one or more suitable memories communicably interconnected with the emulated cluster network adapter 530, the emulated data and management network adapter 531, the disk 533, and the disk 570 via one or more suitable buses. It will be further appreciated that, in a practical implementation, the host hardware platform 595 includes at least one processor operative to execute the storage operating systems 538/539, the host operating system 591, and other software applications out of at least one memory for use in executing a simulated storage operating system in a virtualized computer environment, as described herein.

Figure 6:
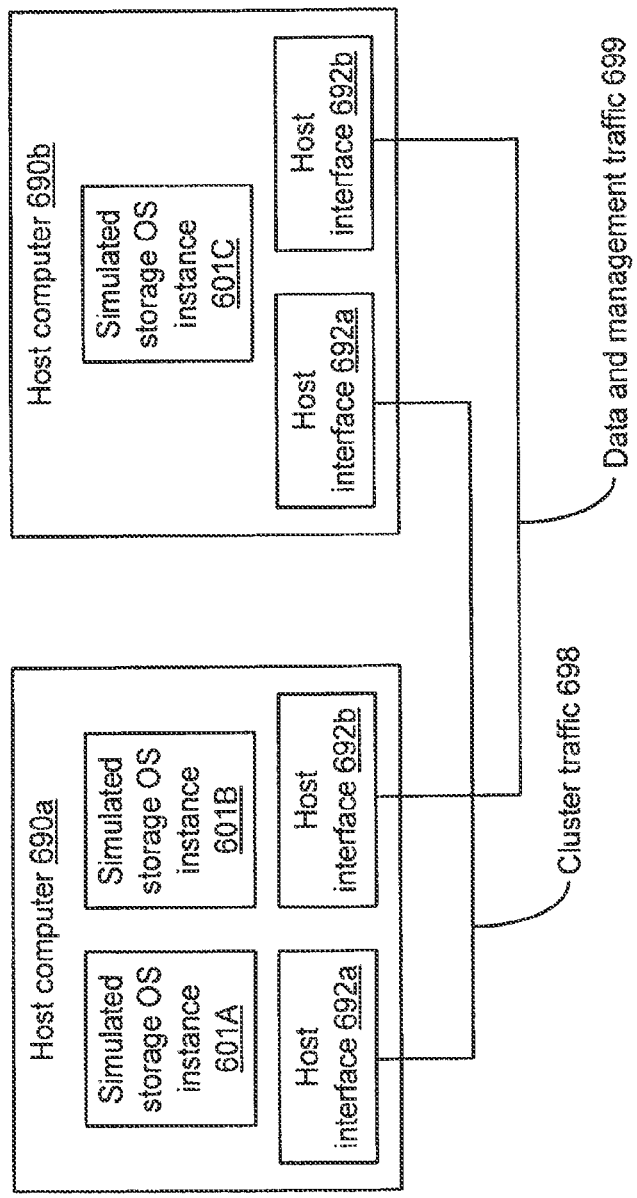
FIG. 6 is a block diagram of multiple instantiations of the storage operating system of FIG. 5.

As discussed above, multiple instantiations of the simulated storage operating system 501 can be executed as multiple guest operating systems running simultaneously on the same host computer hardware. FIG. 6 depicts two such instantiations of the simulated storage operating system 501, namely, a simulated storage OS instance 601A and a simulated storage OS instance 6018, which are operative to run simultaneously on a host computer platform 690a. As further discussed above, multiple instantiations of the simulated storage operating system 501 can be executed as multiple guest operating systems running simultaneously on different host computer hardware platforms. FIG. 6 depicts a third simulated storage OS instance 601C, which is operative to run simultaneously with the instances 601A, 601B on a host computer platform 690b different from the host computer platform 690a.

It should be appreciated that each of the simulated storage OS instances 601A, 601B, 601C is configured to provide the functionality of a server node of a clustered storage server system, including its associated disk(s) for storing volume data. To provide the functionality of a simulated clustered storage server system including three nodes corresponding to the respective instances 601A, 601B, 601C, two network interconnects 698, 699 are provided between host interfaces 692a, 692b of the respective host computers 690a, 690b. Specifically, the network interconnect 698 is configured to carry cluster traffic for each instance 601A, 601B, 601C provided over a cluster network adapter (e.g., one of the emulated cluster network adapters 530a-530b) and an associated virtual interface (e.g., the virtual interface 582a). Further, the network interconnect 699 is configured to carry data and management traffic for each instance 601A, 601B, 601C provided over a data and management network adapter (e.g., the emulated data and management network adapter 531) and an associated virtual interface (e.g., the virtual interface 582b). It is noted that, with regard to the instances 601A, 601B running on the same host computer platform 690a, cluster traffic can be wrapped back to the respective cluster network adapters for the instances 601A, 601B through the associated virtual interfaces. Accordingly, by executing the three simulated storage OS instances 601A, 6018, 601C as guest operating systems running simultaneously on the host computer platforms 690a, 690b, it is possible to test, during development, the operation of a simulated clustered storage server system having three nodes, each with its own simulated storage operating system. It should be appreciated that any suitable number of simulated storage OS instances may be executed as a corresponding number of guest operating systems running on any suitable number of host computer platforms to test the operation of a simulated storage server system and its associated storage operating system.

Figure 7:
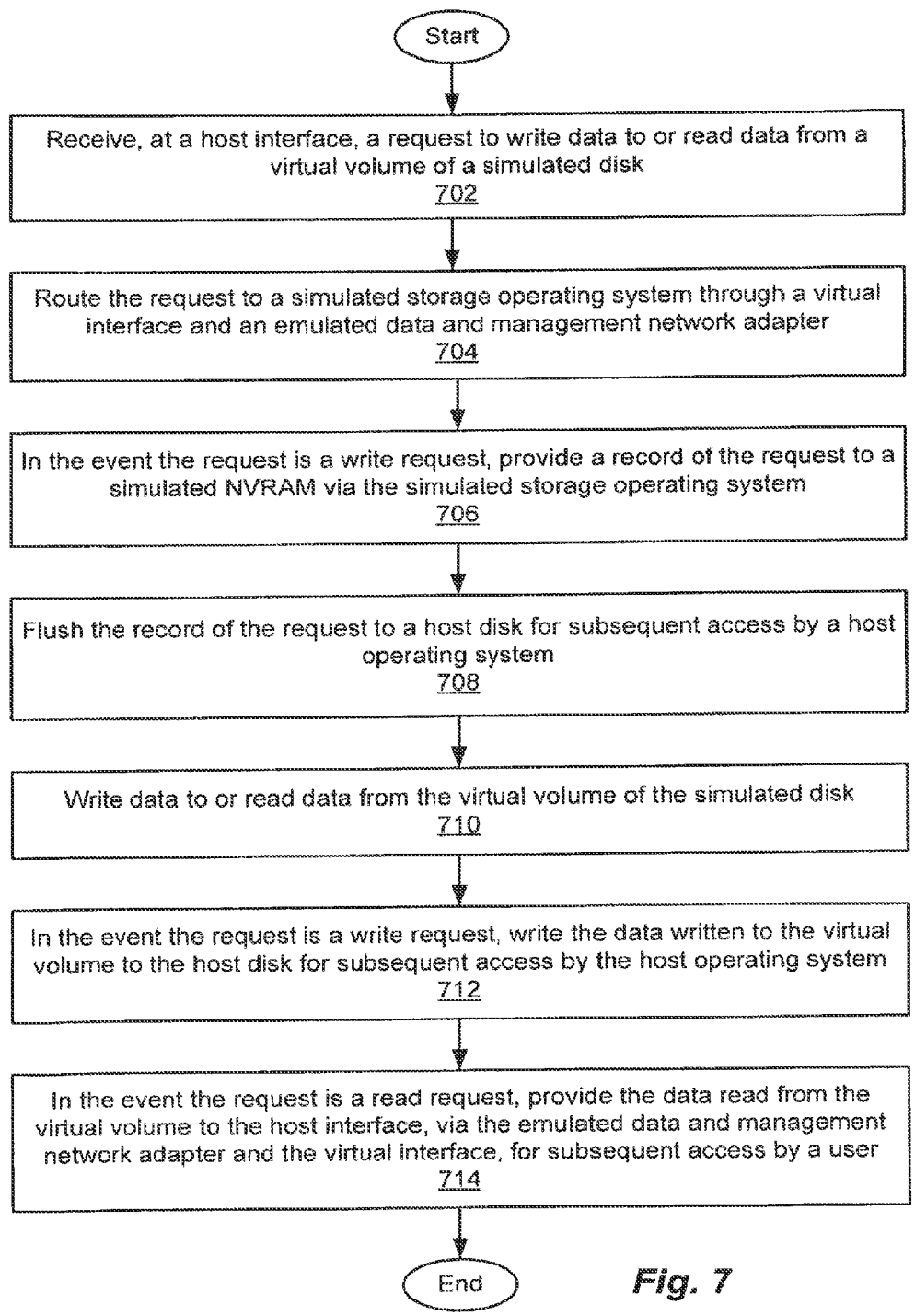
FIG. 7 is a flow diagram illustrating a method of testing the operation of a simulated storage server system and its associated storage operating system according to the present invention.

An illustrative method of testing the operation of a simulated storage server system and its associated storage operating system is described below with reference to FIGS. 5 and 7. As depicted in step 702 (see FIG. 7), a data request within the computer environment 500 is received at the host interface 592b (see FIG. 5). It is noted that such a request can be issued by a user as a command to the simulated storage OS instance 501 via a user interface of a management framework communicably connected to the host computer 590. Moreover, via such a user management interface, the user can create one or more virtual volumes containing simulated data on one or more of the simulated disks 512.1/572, 512.2/573, 512.3a/574, 512.3b/575. It is further noted that the request received at the host interface can be a command to write data to one or more virtual volumes of the simulated disks 512.1/572, 512.2/573, 512.3a/574, 512.3b/575, or a command to read data stored on one or more virtual volumes of the simulated disks 512.1/572, 512.2/573, 512.3a/574, 512.3b/575.

The request is then routed, e.g., through the virtual interface 582b and the emulated data and management network adapter 531, to the simulated storage operating system 538, as depicted in step 704. In the event the request is a command to write data, a record of the request is typically provided or logged, via the simulated storage operating system 538, to the simulated NVRAM 534/571, as depicted in step 706. It is noted that if the request were a command to read data, then a record of the request may or may not be logged to the simulated NVRAM 534/571. In the event a record of the request is logged to the simulated NVRAM 534/571, the record of the request stored in the simulated NVRAM 534/571 is then flushed, through the virtual disk 584, to the host disk 594 for subsequent access by the host operating system 591, as depicted in step 708. Next, based on whether the request is a command to write data or a command to read data, the data is written to or read from the specified simulated disk 512.1/572, 512.2/573, 512.3a/574, or 512.3b/575 via the simulated storage operating system 538, as depicted in step 710. In the event the request is a command to write data, the data written to the specified virtual volume is written, via the virtual disk 584, to the host disk 594 for subsequent access by the host operating system 591, as depicted in step 712. In the event the request is a command to read data, the data is provided to the host interface 592b via the emulated data and management network adapter 531 and the virtual interface 582b for subsequent access by the user via the user management interface, as depicted in step 714.

The above-described system and method can be configured to allow a snapshot to be generated of the state of the virtualized computer environment 500 at a certain point-in-time, for use in managing the creation and restoration of database backups. The term SNAPSHOT™, which is a trademark of NetApp, Inc., generally refers to a rapid generation of an image of data at a certain point-in-time.

It will be appreciated by those of ordinary skill in the art that the above-described method of testing, during development, the operation of a simulated storage server system and its associated storage operating system can be practiced using a development host computer operative to create one or more images of the simulated storage operating system, to associate particular images of the simulated storage operating system with one or more host computers, to distinguish one or more instances of the simulated storage operating system on a particular host computer, to implement a boot loader for performing initial loads of the simulated storage operating system on the respective host computers, to pass configuration parameters through the boot loader to the simulated storage operating system, and to translate requests for volume data into requests for file data on simulated disks of the simulated storage server system.

It will be further appreciated by those of ordinary skill in the art that modifications to and variations of the above-described system and method of operating a storage server on a virtual machine may be made without departing from the inventive concepts disclosed herein. Accordingly, the invention should not be viewed as limited except as by the scope and spirit of the appended claims.

What is claimed is:

1. A virtualized clustered storage server system, comprising:
   at least one host computer having a host operating system; and
   a plurality of virtual computers operating on the at least one host computer, each of the plurality of virtual computers having one or more virtualization components and a guest operating system, said guest operating system being hosted by said host operating system of the at least one host computer,
   wherein each virtual computer of the plurality of virtual computers comprises a storage server system instance, including said guest operating system and at least one facility including at least one simulated storage device for storing data of at least one virtual volume,
   wherein the at least one host computer is to receive commands for manipulating data of a specified virtual volume, wherein each command is directed to a specified storage server system instance, and wherein the at least one host computer routes each of the commands to the respective specified storage server system instance through a virtual interface of the one or more virtualization components of the virtual computer,
   wherein each storage server system instance is to transmit, in response to receipt of a routed command to manipulate data of a specified virtual volume of a different storage server instance, a request to manipulate the data of the specified virtual volume to the different storage server instance using one or more emulated cluster network adapters, and manipulate said data of said specified virtual volume stored on the simulated storage device in accordance with the command, and
   wherein said at least one facility of each storage server system instance is mapped onto at least one corresponding facility of the host operating system via the one or more virtualization components of the virtual computer.

2. The system of claim 1 wherein said at least one facility of the storage server system instance includes at least one simulated non-volatile memory for storing at least one record of the command.

3. The system of claim 2:
   wherein the at least one facility of the host operating system includes a host storage device;
   wherein the one or more virtualization components include a virtual storage device; and
   wherein the at least one simulated non-volatile memory is mapped onto said host storage device via said virtual storage device.

4. The system of claim 2 wherein the at least one host computer includes a host storage device, and wherein said storage server system instance is further operative to send a copy of said at least one record out of the virtual computer to the at least one host computer for subsequent storage on said host storage device.

5. The system of claim 1:
   wherein said at least one facility of the storage server system instance includes at least one emulated management network adapter;
   wherein the at least one facility of the host operating system includes at least one host interface;
   wherein the one or more virtualization components include at least one virtual interface; and
   wherein said at least one emulated management network adapter is mapped onto said at least one host interface via said at least one virtual interface.

6. The system of claim 1 wherein the virtual computer has, within said guest operating system, at least one emulated management network adapter, and wherein said storage server system instance is further operative to receive, into the virtual computer via the emulated management network adapter, one or more of the commands.

7. The system of claim 1:
   wherein said commands include at least one request to retrieve data of said specified virtual volume stored on the simulated storage device, and
   wherein said storage server system instance is operative to retrieve the requested data of said specified virtual volume from the simulated storage device, and to send the retrieved data of said specified virtual volume out of the virtual computer to the at least one host computer.

8. The system of claim 1:
   wherein said commands include at least one request to write data to said specified virtual volume stored on the simulated storage device, and
   wherein said storage server system instance is operative to write said data to said specified virtual volume stored on the simulated storage device.

9. The system of claim 8 wherein the at least one host computer includes a host storage device, and wherein said storage server system instance is further operative to send, to said host storage device, a copy of the data written to said specified virtual volume stored on the simulated storage device.

10. The system of claim 1:
    wherein said at least one host computer comprises at least one first host computer and at least one second host computer;
    wherein said plurality of virtual computers includes a first virtual computer operating on the at least one first host computer and a second virtual computer operating on the at least one second host computer; and
    wherein said at least one simulated storage device of the first virtual computer and said at least one simulated storage device of the second virtual computer store data of at least one virtual volume.

11. The system of claim 1:
    wherein said at least one facility of the storage server system instance includes at least one emulated cluster network adapter;
    wherein the at least one facility of the host operating system includes at least one host interface;
    wherein the one or more virtualization components include at least one virtual interface; and
    wherein said at least one emulated cluster network adapter is mapped onto said at least one host interface via said at least one virtual interface.

12. The system of claim 10:
    wherein each of the first virtual computer and the second virtual computer has, within each respective guest operating system of the first and second virtual computers, at least one emulated cluster network adapter; and
    wherein the storage server system instance of each one of the first and second virtual computers is operative to communicate, through the respective first and second host computers, with the storage server system instance of the other one of the first and second virtual computers via the respective emulated cluster network adapters.

13. The system of claim 1 wherein said at least one facility of the storage server system instance includes a simulated flashcard for receiving one or more of simulated program code and simulated data.

14. The system of claim 13:
wherein the at least one facility of the host operating system includes a host storage device;
wherein the one or more virtualization components include a virtual storage device; and
wherein the simulated flashcard is mapped onto said host storage device via said virtual storage device.

15. A method for providing a virtualized clustered storage server system, the method comprising:
operating a plurality of virtual computers on at least one host computer, each of the plurality of virtual computers having one or more virtualization components and a guest operating system, said guest operating system being hosted by a host operating system of the at least one host computer, wherein each virtual computer of the plurality of virtual computers comprises a storage server system instance, the storage server system instance including at least one facility comprising at least one simulated storage device for storing data of at least one virtual volume;
mapping said at least one facility of the storage server system instance onto at least one corresponding facility of the host operating system via the one or more virtualization components of the virtual computer hosting the storage server system instance;
receiving, by the at least one host computer, at least one command for manipulating data of a specified virtual volume stored on the simulated storage device, wherein the at least one command is directed to a specific storage server system instance, and wherein the specified virtual volume is managed by a different storage server system instance;
routing, by the at least one host computer, the at least one command to the specific storage server system instance through a virtual interface of the one or more virtualization components of the virtual computer hosting the specific storage server system instance; and
transmitting, by the specific storage server system instance, a request to the different storage server system instance to manipulate the data of the specified virtual volume.

16. The method of claim 15:
wherein said at least one facility of the storage server system instance includes at least one simulated non-volatile memory for storing at least one record of the at least one command;
wherein the at least one facility of the host operating system includes a host storage device of the at least one host computer; wherein the one or more virtualization components include a virtual storage device; and
wherein said mapping includes mapping the at least one simulated non-volatile memory onto said host storage device via said virtual storage device.

17. The method of claim 15 further including storing at least one record of the at least one command in at least one simulated non-volatile memory of the virtual computer.

18. The method of claim 17 further including sending a copy of said at least one record out of the virtual computer to the at least one host computer for subsequent storage on a host storage device of the at least one host computer.

19. The method of claim 15:
wherein said at least one facility of the storage server system instance includes at least one emulated management network adapter;
wherein the at least one facility of the host operating system includes at least one host interface;
wherein the one or more virtualization components include at least one virtual interface; and
wherein said mapping includes mapping said at least one emulated management network adapter onto said at least one host interface via said at least one virtual interface.

20. The method of claim 15 further including receiving, via an emulated management network adapter within said guest operating system, the at least one command into the virtual computer from the at least one host computer.

21. The method of claim 15 wherein said at least one command includes at least one request to retrieve data of said specified virtual volume stored on the simulated storage device and wherein said method further includes retrieving the requested data of said specified virtual volume from the simulated storage device of the different storage server system instance, and sending the retrieved data of said specified virtual volume out of the virtual computer to the at least one host computer.

22. The method of claim 15 wherein said at least one command includes at least one request write data to said specified virtual volume stored on the simulated storage device, and wherein said method further includes writing said data to said specified virtual volume stored on the simulated storage device of the different storage server system instance.

23. The method of claim 22 further including sending, to a host storage device of the at least one host computer, a copy of the data written to said specified virtual volume stored on the simulated storage device.

24. The method of claim 15:
wherein said at least one facility of the storage server system instance includes at least one simulated flashcard for receiving one or more of simulated program code and simulated data;
wherein the at least one facility of the host operating system includes a host storage device of the at least one host computer;
wherein the one or more virtualization components include a virtual storage device; and
wherein said mapping includes mapping the at least one simulated flashcard onto said host storage device via said virtual storage device.

25. A non-transitory computer-readable storage medium having stored thereon instructions for causing one or more processors to perform operations comprising:
operating a plurality of virtual computers on at least one host computer, each of the plurality of virtual computers having one or more virtualization components and a guest operating system, said guest operating system being hosted by a host operating system of the at least one host computer, wherein each virtual computer comprises a storage server system instance, the storage server system instance including at least one facility comprising at least one simulated storage device for storing data of at least one virtual volume;
mapping said at least one facility of the storage server system instance onto at least one corresponding facility of the host operating system via the one or more virtualization components of the virtual computer hosting the storage server system instance;
receiving, by the at least one host computer, at least one command for manipulating data of a specified virtual volume stored on the simulated storage device, wherein the at least one command is directed to a specific storage server system instance, and wherein the specified virtual volume is managed by a different storage server system instance;

routing, by the at least one host computer, the at least one command to the specific storage server system instance through a virtual interface of the one or more virtualization components of the virtual computer hosting the specific storage server system instance; and transmitting, by the specific storage server system instance, a request to the different storage server system instance to manipulate the data of the specified virtual volume.

26. The non-transitory computer-readable storage medium of claim 25:

wherein said at least one facility of the storage server system instance includes at least one emulated management network adapter;

wherein the at least one facility of the host operating system includes at least one host interface;

wherein the one or more virtualization components include at least one virtual interface; and wherein said mapping includes mapping said at least one emulated management network adapter onto said at least one host interface via said at least one virtual interface.

27. The non-transitory computer-readable medium of claim 25, wherein said at least one command includes at least one request write data to said specified virtual volume stored on the simulated storage device, and wherein said operations further include writing said data to said specified virtual volume stored on the simulated storage device of the different storage server system instance.

* * * * *